(12) United States Patent
Le Scouarnec et al.

(10) Patent No.: US 7,940,197 B2
(45) Date of Patent: May 10, 2011

(54) NETWORK RE-ENCODING METHOD AND DEVICE FOR RE-ENCODING ENCODED SYMBOLS TO BE TRANSMITTED TO COMMUNICATION EQUIPMENTS

(75) Inventors: Nicolas Le Scouarnec, Rennes (FR);
Mary-Luc Champel, Marpire (FR)

(73) Assignee: Thomson Licensing, Issey les Moulineaux (FR)

( * ) Notice: Subject to any disclaimer, the term of this patent is extended or adjusted under 35 U.S.C. 154(b) by 0 days.

(21) Appl. No.: 12/657,636

(22) Filed: Jan. 25, 2010

(65) Prior Publication Data
US 2010/0188271 A1    Jul. 29, 2010

(30) Foreign Application Priority Data

Jan. 27, 2009    (EP) .................................... 09305072

(51) Int. Cl.
*H03M 7/00*    (2006.01)
(52) U.S. Cl. .......................................... 341/50; 341/51
(58) Field of Classification Search ............... 341/50–51
See application file for complete search history.

(56) References Cited

U.S. PATENT DOCUMENTS

2009/0265141 A1* 10/2009 Aly et al. ...................... 702/188
2009/0285148 A1* 11/2009 Luo et al. ...................... 370/315

OTHER PUBLICATIONS

Puducheri S. et al.: "Coding Schemes for an erasure relay channel" Proc., IEEE International Symposium on Information Theory, ISIT 2007, Jun. 24, 2007, pp. 666-670.
Jing Li et al.: "Multi-source multihop wireless networks: A trellis representation and network coding" Proc., IEEE International Conference on Communication, ICC 08, May 19, 2008, pp. 2740-2744.
Chuan Wu et al.: rStream: Resilient and optimal peer-to-peer streaming with rateless codes: IEEE Transactions on Parallel and Distributed Systems, IEEE Service Center. Los Alamitos, CA, US, vol. PP, No. 1, Jan. 1, 2008, pp. 77-92.
Luby M.: "LT codes" Proc., IEEE $43^{RD}$, Annual Symposium on Foundations of Computer Science (FOCS 2002). Vancouver, BC, Canada, Nov. 16, 2002, Nov. 19, 2002. pp. 271-280, Search report dated Jun. 10, 2009.

* cited by examiner

*Primary Examiner* — Khai M Nguyen
(74) *Attorney, Agent, or Firm* — Robert D. Shedd; Jeffrey M. Navon

(57) ABSTRACT

A network re-encoding device is intended for re-encoding encoded symbols to be transmitted to at least one communication equipment connected to a network. This network re-encoding device comprises a re-encoding means arranged for re-encoding output nodes, defined by LT code symbols representative of encoded symbols and representative respectively of the results of XOR Boolean operation between input nodes defining decoded symbols whose values have to be discovered and to which they are linked into a Tanner graph, by combining chosen input node and/or output node having known values, in order to produce new LT code symbols defining generated output nodes ready to be transmitted.

14 Claims, 3 Drawing Sheets

NETWORK RE-ENCODING METHOD AND DEVICE FOR RE-ENCODING ENCODED SYMBOLS TO BE TRANSMITTED TO COMMUNICATION EQUIPMENTS

This application claims the benefit, under 35 U.S.C. §119 of EP Patent Application 09305072.2, filed 27 Jan. 2009.

TECHNICAL FIELD

The present invention relates to symbol data processing and more precisely to decoding of received encoded symbol and encoding of symbol data to be transmitted to communication equipments connected to a network.

One means here by "symbol" a block or packet of data.

BACKGROUND OF THE INVENTION

As it is known by the man skilled in the art, it may occur that data be lost or corrupted during their transmission between communication equipments. In this case the receiver may require from the sender that it transmits again the lost or corrupted data, or two copies of the data may be initially transmitted. Another solution consists in encoding the data to be transmitted by means of codes and more precisely erasure correcting codes. In this case, it is not necessary to wait having received every data of a content to be able to decode them, because only a (sufficient) part of these content data is required to rebuild all the data transmitted by the sender.

Among the encoding method the one named "network coding" offers several advantages. This encoding method has been proposed by Rudolf Ahlswede and al, in "Network information flow", IEEE Transactions On Information Theory 2000. It may be used in wireless and/or internet networks, for instance. Network coding allows internal (or intermediate) routers of a network to send combinations of data of the type c=f(a,b) when it receives data a and b, instead of only forwarding the received data a or b. So, network coding allows reaching a maximal flow over a network whereas routing appears to be not powerful enough to reach a maximal flow in some networks. But this requires that routers be capable of performing computation on the received data to encode them before transmitting them, and that each final receiver be capable of decoding the encoded data it receives.

As computing the set of functions f( ) that allows to reach a maximal flow is proven to be NP-Hard, some probabilistic schemes have been proposed.

For instance, a scheme using rateless random linear network codes (RLNC) has been proposed by T. Ho and al, in "A random linear network coding approach to multicast", IEEE Transaction on Information Theory 2006. This scheme has several advantages: it is rather simple to implement and can be fully distributed. According to this scheme, each router of a network forwards a random linear combination of the data it receives (inputs) to the other routers of its network. The receiver also receives a matrix of coefficient and data that allow it to decode the received data through a Gauss or Gauss-Jordan elimination when this matrix is invertible.

Network coding allowing to generate symbols independently, infinite is streams of symbols can be generated. However, random linear network codes involve complex computations not only during encoding but also during decoding. Moreover, as the RLNCs operate on the Gallois Field $GF(2^k)$, they are not suitable for encoding and decoding over general purpose processors that lack arithmetic on finite fields.

Another scheme, using Raptor codes, has been proposed by N. Thomos and P. Frossard, in "Collaborative video streaming with Raptor network coding", ICME 2008. This scheme introduces a re-encoding method consisting in combining encoded symbols of a pair by means of a XOR Boolean operation. But, this scheme also requires Gaussian elimination during decoding, and therefore a raptor network coding loses its advantages in term of performance and properties.

Another scheme has also been proposed by Puducheri S. et al. in "Coding Schemes for an erasure relay channel" Proc. IEEE International Symposium on Information Theory, ISIT 2007, 24 Jun. 2007, pages 666-670.

SUMMARY OF THE INVENTION

So the object of this invention is to propose network re-encoding method and device using rateless codes named Luby Transform codes (or LT codes) whose structure allows the use of low complexity encoders and decoders.

It is recalled that LT codes are parity codes which have been proposed by Michael Luby in IEEE Symposium on Foundations of Computer Science 2002. LT codes can be represented by a Tanner graph establishing a correspondence between input nodes and output nodes. Each output node of the tanner graph is an encoded symbol (or LT code symbol (or else LT Codeword)) to be decoded and which has been received from the network and is linked (through edges) to one or more non-encoded (or decoded) to symbols to discover, called input nodes, and is representative of the result of XOR Boolean operation(s) between these input nodes. So, when a decoder of a communication equipment (such as a router or a user terminal, for instance) receives encoded symbols (i.e. LT codes symbols) with data representative of their respective links, these encoded symbols constitute the output nodes of a Tanner graph that must be decoded, for instance by means of a "belief-propagation (BP) decoding method", to produce non-encoded (or decoded) symbols constituting input nodes of this Tanner graph. The number of links (or edges) between an output node and input nodes defines the degree of this output node. So, it is possible to build the distribution of degrees of the output nodes of a Tanner graph. The ability of LT codes to be decoded efficiently by means of a belief-propagation decoding method relies on their particular distribution of degrees. This efficiency is all the more important as the distribution of degrees of the LT codes is the so-called "robust soliton" distribution.

The invention provides a network re-encoding method, intended for re-encoding encoded symbols (or data) to be transmitted to at least one communication equipment of a network, and comprising the step of re-encoding output nodes, defined by LT code symbols representative of encoded symbols and representative respectively of the results of XOR Boolean operation(s) between input nodes defining decoded symbols whose values have to be discovered and to which they are linked into a Tanner graph, by combining chosen input node(s) and/or output node(s) having known values and called partially decoded nodes, in order to produce new LT codes defining generated output nodes ready to be transmitted.

The method according to the invention may include additional characteristics considered separately or combined, and notably:
- one may combine the partially decoded nodes by means of XOR Boolean operations therebetween;
- one may start by determining among degrees of a current distribution of degrees of the generated output nodes the one having the highest difference with a same degree of a first chosen reference distribution, and which allows to produce a generated output node having this degree, then one may produce a generated output node having this degree by combining at least one partially decoded node (i.e. a node which is temporarily generated during internal re-encoding steps);

one may determine a degree allowing to produce a generated output node having this degree by means of a chosen heuristic;

after having produced the generated output node, one may compare the current distribution of the input nodes with a second chosen reference distribution in order to determine if at least one input node has been too much used to produce generated output nodes and in the affirmative if this input node allows to let unchanged the degree of the generated output node when combined to input nodes linked to this generated output node, then one may replace at least one of these too much used input nodes into the generated output node by an input node having been too rarely used, in order to normalize the current distribution of the input nodes;

one may combine the generated output node with an output node which comprises the too much used input node and having a degree equal to 2;

after having produced the generated output node ready to be transmitted, one may update the current distribution of degrees of the generated output nodes and the current distribution of the input nodes;

the heuristic may consist in checking that the degree of the node to be generated is lower or equal to a number of covered input nodes comprising the decoded input nodes and the input nodes having at least one neighbor (i.e. an output node to which it is linked in the Tanner graph);

the heuristic may further consist in checking if the condition $$d \leq \sum_{1}^{d} k \cdot n(k)$$

is verified, where d is the determined degree of the output node to be generated and n(k) is the number of partially decoded nodes of degree k smaller than d that are known.

The invention also provides a network re-encoding device, intended for re-encoding encoded symbols (or data) to be transmitted to at least one communication equipment of a network, and comprising a re-encoding means arranged for re-encoding output nodes, defined by LT code symbols representative of encoded symbols and representative respectively of the results of XOR Boolean operation(s) between input nodes defining decoded symbols whose values have to be discovered and to which they are linked into a Tanner graph, by combining chosen input node(s) and/or output node(s) having known values and called partially decoded nodes, in order to produce new LT code symbols defining generated output nodes ready to be transmitted.

The network re-encoding device according to the invention may include additional characteristics considered separately or combined, and notably:

its re-encoding means may be arranged for combining the partially decoded nodes by carrying out XOR Boolean operations therebetween;

its re-encoding means may be arranged for determining among degrees of a current distribution of degrees of the generated output nodes the one having the highest difference with a same degree of a first chosen reference distribution, and which allows to produce a generated output node having this degree, then for combining at least one partially decoded node to produce a generated output node having this degree;

its re-encoding means may be arranged for applying a chosen heuristic to determine a degree allowing to produce a generated output node having this degree;

its re-encoding means may be arranged, after having produced the generated output node, for comparing the current distribution of the input nodes with a second chosen reference distribution in order to determine if at least one input node has been too much used to produce generated output nodes and in the affirmative if this input node allows to let unchanged the degree of this generated output node when combined to input nodes linked to this generated output node, then for replacing at least one of these too much used input nodes into the generated output node by an input node having been too rarely used, in order to normalize the current distribution of the input nodes;

its re-encoding means may be arranged for combining the generated output node with an output node which comprises the too much used input node and having a degree equal to 2;

its re-encoding means may be arranged for combining the generated output node with an output node which comprises the two too much used input nodes having a degree equal to 1;

its re-encoding means may be arranged, after having produced the generated output node ready to be transmitted, for updating the current distribution of degrees of the generated output nodes and the current distribution of the input nodes;

its re-encoding means may be arranged for applying a heuristic consisting in checking that the degree of the node to be generated is lower or equal to a number of covered input nodes comprising the decoded input nodes and the input nodes having at least one neighbor;

its re-encoding means may be arranged for applying a heuristic further consisting in checking if the condition $$d \leq \sum_{1}^{d} k \cdot n(k)$$

is verified, where d is the determined degree of the output node to be generated and n(k) is the number of partially decoded nodes of degree k smaller than d that are known.

The invention also provides a decoder, intended for equipping a communication equipment that can be connected to a network, and comprising a decoding means arranged for:

applying a chosen decoding method to received output nodes, defined by LT code symbols representative of encoded symbols, and representative respectively of the results of XOR Boolean operation(s) between input nodes defining decoded symbols whose values have to be discovered and to which they are linked into a Tanner graph, in order to get their respective linked input nodes, and storing data defining the input nodes and the output nodes in correspondence with a degree representative of the number of links these input nodes and output nodes have with other output nodes and input nodes of the same Tanner graph (in other words it maintains an index allowing a random access to nodes of chosen degrees).

This decoder may further comprise a network re-encoding device of the type presented above and coupled to its decoding means.

This decoder may also further comprise a detection means arranged, in the presence of an output node to be decoded, for determining if it has been previously received by its decoding means, and, in the affirmative, for generating a message signalling that it has been previously received (and possibly previously obtained during a decoding step) and does not have to be inserted again into the Tanner graph.

BRIEF DESCRIPTION OF THE FIGURES

Other features and advantages of the invention will become apparent on examining the detailed specifications hereafter and the appended drawings, wherein.

DETAILED DESCRIPTION OF THE PREFERRED EMBODIMENT

The appended drawings may serve not only to complete the invention, but also to contribute to its definition, if need be.

The invention aims at offering a network re-encoding method and a corresponding network re-encoding device (D), intended for re-encoding LT code symbols in order to allow the use of low complexity encoders and decoders into communication equipments that are connected therebetween through a network.

In the following description it will be considered that the network is a mobile (or cellular or else radio) communication network (CN) in which communication equipments (CEi) are capable of transmitting contents therebetween at least in a broadcast or ad-hoc mode. But the invention is not limited to this type of network. Indeed, the network may be also of the wired (or fixed) type, such as a DSL network or an optical fiber network or else a cable network, notably if it allows communication equipments to communicate therebetween in a peer-to-peer (P2P) mode.

Moreover, the communication equipments (CEi) may be of any type as soon as they are capable of establishing communications therebetween. So a communication equipment (CEi) may be a router, a fixed personal computer, a laptop, a content receiver (for instance a home gateway or a set-top box (STB) located in a user's home premise), a mobile or cellular telephone, a fixed telephone, or a personal digital assistant (PDA), provided that it comprises a communication modem (or any equivalent communication means).

Figure 1:
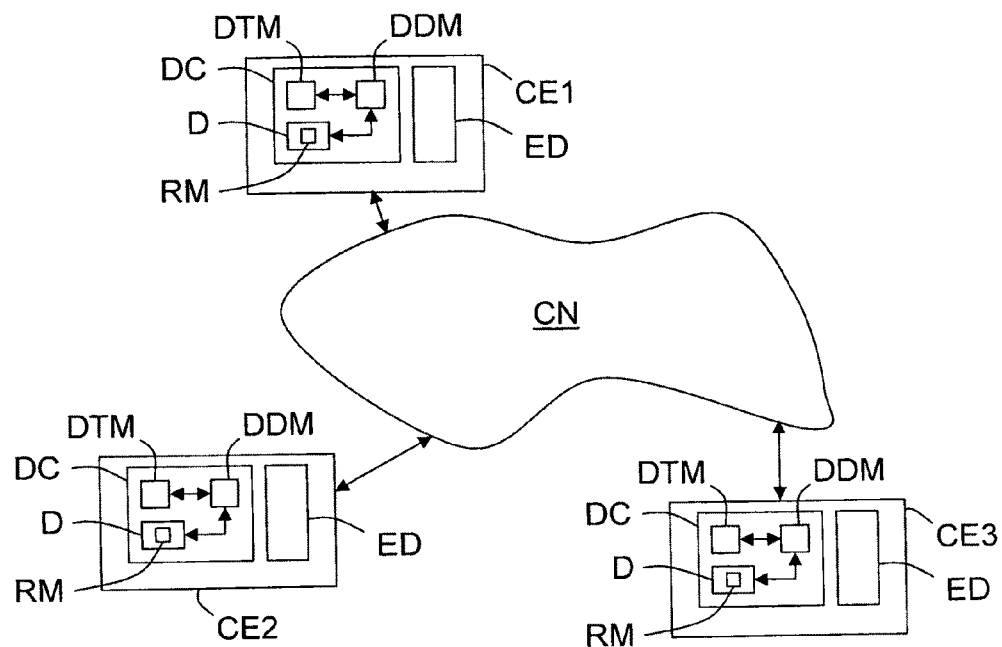
FIG. 1 schematically and functionally illustrates three user communication equipments connected therebetween through a network and each comprising an encoder and an example of embodiment of a decoder according to the invention, FIG. 2 schematically illustrates a Tanner graph of a decoder according to the invention.

In the following description it will be considered that the communication equipments (CEi) belong to users and are mobile telephones. In FIG. 1 only three mobile telephones CE1 to CE3 (i=1 to 3) have been illustrated, but in a mobile network much more communication equipments are usually capable of exchanging at least part of encoded contents therebetween.

In the illustrated example, each mobile telephone CEi comprises an encoder ED of a classical type and a decoder DC according to the invention. But it is important to note that some communication equipments CEi, and notably those which initially provide the contents, may only comprise an encoder ED of a classical type and possibly a decoder of a classical type, while some other communication equipments CEi, and notably those which receive and forward contents, may only comprise a decoder DC according to the invention or a decoder of a classical type, adapted according to the invention, and a network re-encoding device D according to the invention.

One means here by "encoder of a classical type" an encoder which is capable of encoding non-encoded (content) data (or symbol (content) data) in order to produce LT code symbols. Moreover one means here by "decoder of a classical type" a decoder capable of decoding LT code symbols produced by an encoder of a classical type ED or by a network re-encoding device D according to the invention, by means of a known and classical decoding method. More one means here by "decoder according to the invention" a decoder of a new type, i.e. capable of decoding LT code symbols by means of a known and classical decoding method, and adapted to simplify the working of a network re-encoding device D according to the invention to which it is locally coupled or that it comprises. In the following description it will be considered, as non limiting example, that the decoding method is the so-called "belief-propagation (BP) decoding method". But the invention is not limited to this decoding method.

As illustrated a network re-encoding device D according to the invention comprises a re-encoding module RM which is arranged for accessing to the associated decoder DC, and notably to its internal state (and therefore to its Tanner graph and associated data), for re-encoding symbols previously received by its mobile telephone CEi from one or more other mobile telephones CEi'.

As mentioned before these LT code symbols are representative of encoded symbols. They are transmitted into blocks of data with associated data representative of their respective links with non-coded symbol data having known values.

An LT code symbol is the result of the combination of the values of one or more symbol data, and more precisely of XOR Boolean operation(s) between symbol data. In other words the links of an output node designate the non-encoded symbols that have been combined by means of XOR to Boolean operation(s) to produce it.

So, when a decoder DC of a communication equipment CEi receives encoded symbols (i.e. LT code symbols) with data representative of their respective links, it has to decode these encoded symbols with the associated data to recover the corresponding non-encoded symbols. For this purpose the decoding module DDM of the decoder DC feeds a Tanner graph with the received LT code symbols (or encoded symbols) which then define output nodes ON. In the same time, the non-encoded symbols to be recovered define input nodes IN of the Tanner graph which are linked to the associated output nodes.

Figure 2:
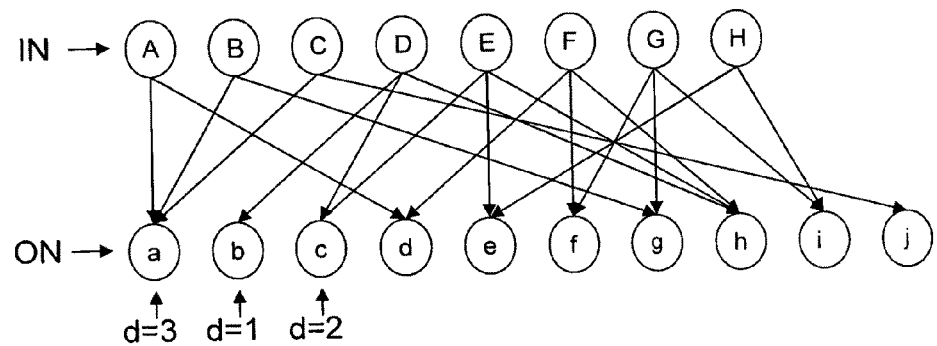

A limited example of a Tanner graph is illustrated in FIG. 2. In this example, ten output nodes ON (a-j) are linked to one or more input nodes IN of a group of eight (A-H). More precisely:

the output node a is linked to input nodes A, B and C, and then is the result of their combination by means of two XOR Boolean operations (a=A⊕B⊕C), the output node b is linked to input node B, and then is equal to B, the output node c is linked to input nodes D and E, and then is the result of their combination by means of one XOR Boolean operation (c=D⊕E), the output node d is linked to input nodes A and F, and then is the result of their combination by means of one XOR Boolean operation (d=A⊕F), the output node e is linked to input nodes E and H, and then is the result of their combination by means of one XOR Boolean operation (e=E⊕H), the output node f is linked to input nodes F and G, and then is the result of their combination by means of one XOR Boolean operation (f=F⊕G), the output node g is linked to input nodes B and G, and then is the result of their combination by means of one XOR Boolean operation (g=B⊕G), the output node h is linked to input nodes D, E and F, and then is the result of their combination by means of two XOR Boolean operations (h=D⊕E⊕F), the output node i is linked to input nodes G and H, and then is the result of their combination by means of one XOR Boolean operation (i=G⊕H), and the output node j is linked to input node C, and then is equal to C.

It is important to note that the number of links (or edges) between an output node ON and input nodes IN defines the degree of this output node ON. So, in the example mentioned above:

the degree of a is equal to 3,
the degree of b is equal to 1,
the degree of c is equal to 2,
the degree of d is equal to 2,
the degree of e is equal to 2,
the degree of f is equal to 2,
the degree of g is equal to 2,
the degree of h is equal to 3,
the degree of i is equal to 2, and
the degree of j is equal to 1.

By definition in the following description:

an "input node" is a node representing original data in the Tanner graph, a "decoded input node" is an input node whose value is known. It will never have any links (or edges) and will never be present in output nodes ON of the Tanner graph. A non-decoded input node does not have a known value and cannot be used while re-encoding, a "covered input node" is either an input node that is decoded or an input node with at least one neighbor (i.e. an output node to which it is linked in the Tanner graph), an "output node" is a node representing encoded symbols. It may have been received or may result from decoding steps, a "partially decoded node" (or "known node") is either a decoded input node or an output node with a known value, a "generated output node" is a node generated by a network re-encoding device D and ready to be transmitted to one or more communication equipments CEi, and a "partially generated node" is a node which is temporarily generated by a network re-encoding device D during internal re-encoding steps.

The decoder DC stores the Tanner graph into a storing means, such as a memory, for instance.

The re-encoding module RM is arranged for re-encoding output nodes by combining chosen partially decoded nodes (or known nodes), i.e. input node(s) and/or output node(s) having known values, in order to produce new LT code symbols defining generated output nodes ready to be transmitted.

These combinations consist preferably in XOR Boolean operations between partially decoded nodes. But it could be also, for instance, a linear combination in a finite field (GF($p^q$)). However, this requires to store a coefficient for the linear combination on all edges (or links).

The network re-encoding device D according to the invention (and notably its re-encoding module RM) is preferably made of software modules, at least partly. But it could be also made of electronic circuit(s) or hardware modules, or a combination of hardware and software modules (in this case the re-encoding device D comprises also a software interface allowing interworking between the hardware and software modules). In case where it is exclusively made of software modules it can be stored in a memory of the communication equipment CEi (for instance in its decoder DC), or in any computer software product, such as a CD-ROM, for instance, which can be read by a communication equipment CEi.

To re-encode output nodes ON the re-encoding module RM implements a network re-encoding method which is described hereafter.

For instance, the method comprises a first step consisting in determining among degrees dj of the current (or actual) distribution of degrees of the output nodes ON, which have been generated up to now, the one having the highest difference with the same degree of a first chosen reference distribution, and which allows to produce a generated output node having this degree.

This first chosen reference distribution can be the so-called robust soliton distribution.

It is of interest to note that the distributions are over discrete sets.

Figure 3:
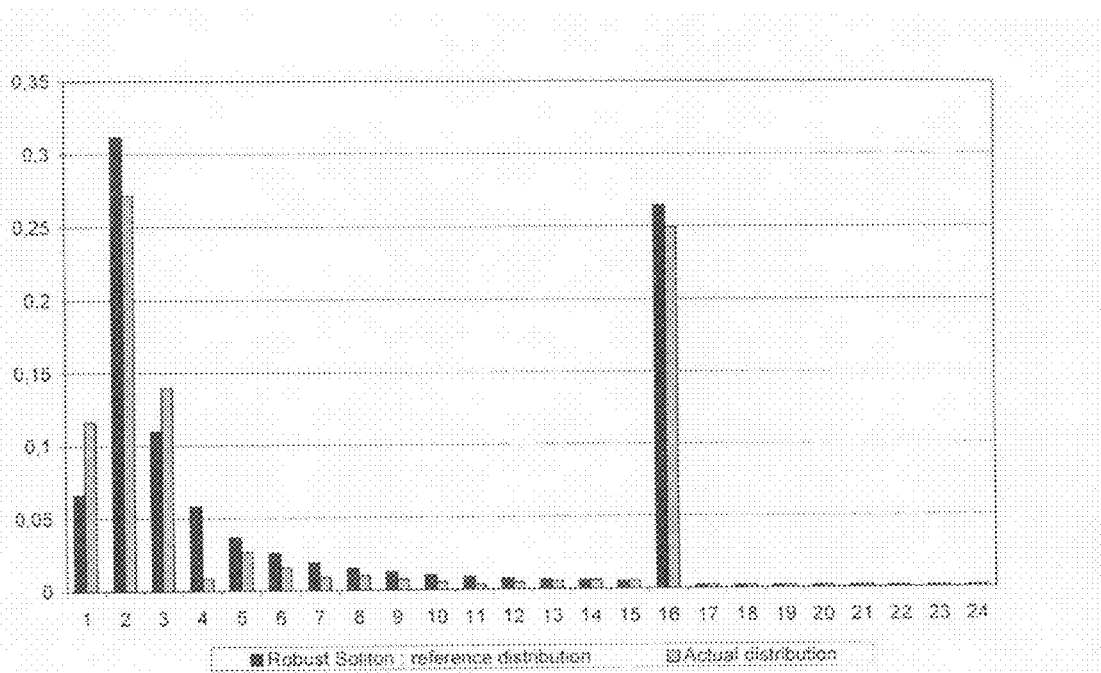
FIG. 3 is a graph illustrating an example of robust soliton distribution of degrees (black) and an example of actual (or current) computed distribution of degrees of generated output nodes (grey)

An example of robust soliton distribution of degrees of generated output nodes (in black) and an example of actual (or current) distribution of degrees of generated output nodes (in grey) are both illustrated in the graph of FIG. 3.

For instance, the re-encoding module RM may first compute the difference between the current distribution and the first chosen reference distribution for each degree. Then it can sort the results. In the example illustrated in FIG. 3, one may observe that the highest difference between the same degree of the two distributions appears on the degree equal to 4, then on the degree equal to 2, then on the degree equal to 16, then on the degree equal to 5, and so on.

The current distribution of degrees of generated output nodes can be computed by the re-encoding module RM from information relative to the output nodes it has previously generated and that it stores into a storing means, such as a memory, for instance.

The computation of the degree differences between the current distribution and the first chosen reference distribution aims at determining which degree of the current distribution must be used preferentially for the next output node to be generated in order to make this current distribution closer to the first chosen reference distribution. Indeed, as it is known by the man skilled in the art performances of LT codes depend on their distribution, so these performances are optimal when the current distribution of LT code symbols is maintained close to an optimal distribution, such as the robust soliton distribution.

So, once the re-encoding module RM has computed the degree differences between the current distribution and the first chosen reference distribution it can sort the results to get a list of degree suggestions for enhancing the current distribution.

Then, for each suggestion of degree dj, it can check if it can generate a node of degree dj. For this purpose it can use a heuristic.

For instance the heuristic may consist in checking that the degree d of the output node to be generated is lower or equal to a number of covered input nodes (i.e. the decoded input nodes and the input nodes having at least one neighbor). The value of this number is kept up-to-date by the decoder DC.

In order to give better results this heuristic may be completed with another condition, such as the one described hereafter.

As one cannot use an output node of degree r to generate an output node of degree d smaller than r (d<r), the re-encoding module RM may check if the condition $$d \leq \sum_{1}^{d} k \cdot n(k)$$

is verified, where d is the determined degree of the output node to be generated and n(k) is the number of partially decoded nodes of degree k smaller than d that are known. In other word it has to check if there are enough partially decoded nodes of degree k smaller than d (k<d) to generate an output node of degree d.

The above heuristic does not consider the fact that when two nodes of degree 3 are combined by means of an XOR Boolean operation, it is not sure that this will give a node of degree 6. Indeed if one combines a first node $s=a\oplus b\oplus c$ with a second node $t=d\oplus e\oplus b$, one obtains a node $(s\oplus t)$ of degree 4 ($s\oplus t=a\oplus d\oplus c\oplus e$, because $b\oplus b=0$).

So the re-encoding module RM may use a more complex heuristic which computes an expected number of conflicts.

It is important to note that during the decoding process of LT code symbols, once an encoded symbol (or input node) has been decoded, every link (or edge) it has with an output node of the Tanner graph is removed from this Tanner graph. Therefore, if an input node is decoded, it will not be involved anymore in another node and will not produce any conflict.

Let $n_0$ be the number of decoded input nodes, $n_{covered}$ be the number of covered input nodes, and $n_{total}$ be the total number of partially decoded nodes. With these definitions, the number of conflicts, when a node of degree k>1 is added to a generated node of degree $D_s$, follows an hyper-geometric law of parameters (k, $D_s-n_0$, $n_{covered}-n_0$) whose mean $C_{s+1}$ is given by:

$$C_{s+1}=k*(D_s-n_0)/(n_{covered}-n_0).$$

Therefore, the degree $D_{s+1}$ of a node once a s+1-th node has been added is given by $D_{s+1}=D_s+k-2*C_{s+1}$, with $D_0=n_0$ (it is also possible to set $D_0=0$ and to add $n_0$ at the last step, but this requires to use the following definition for $C_{s+1}$: $C_{s+1}=k*(D_s/(n_{covered}-n_0))$.

In order to check if a node of degree d can be generated, one may implement the two following sub steps.

A first sub step consists in checking that the degree d of the node to be generated is lower or equal to the number of covered input nodes.

A second sub step consists in adding all nodes of degree k smaller or equal to the wished (or expected) degree d (k≦d) to compute the degree D (which is the resulting degree once every combinations have been carried out). If D≧d, one can deduce that it is possible to generate a node of degree d. D can be computed recursively with an algorithm consisting in checking if it is possible to generate a node of degree L. One does not aggregate all nodes in "one shot" but one only aggregates a node if this may increase the current degree. Indeed, if the nodes are aggregated in one shot the result of this aggregation may be a node of degree smaller than anyone of them (for instance, $(a\oplus b\oplus c\oplus d)\oplus(a\oplus b\oplus c)=d$). Therefore, at each iteration one only keeps the maximum of the previous value and the value once a node is added. This can be done by means of a routine such as the following one:

D=0
For k=d to 2
   For i=1 to n(k) [where n(k) is the number of known nodes of degree k]
      D=max(D,D+k−2*k*(D)/($n_{covered}-n_0$))
   EndFor
EndFor
Return D+$n_0$ ≦ L.

The preceding heuristic can be improved by replacing its second sub step with another one in order to consider possible conflicts while avoiding to exceed a chosen objective.

This other second sub step consists in progressively adding nodes from high degree to low degree, given that a node is added only if its degree is lower or equal to the difference between L and D. In other words this node must not exceed the remaining space in the re-encoded symbols to be generated because one does not want to generate an encoded symbols of too high degree. Therefore, if, for instance, one wants to generate a node of degree 6, one cannot add two nodes of degree 5, but one must add one node of degree 5 and one node of degree 1. This can be done by means of a is routine such as the following one:

D=0
For k=d to 2
   For i=1 to n(k) [where n(k) is the number of known nodes of degree k]
      D=max(D,D+k−2*$E_{conflicts}$(K,D)) [where $E_{conflicts}$(k,D) is equal to k*D/($n_{covered}-n_0$) and corresponds to the number of conflicts one can expect when adding a node of degree k to a partially generated node of degree D, when all nodes are taken in a Tanner graph with $n_{covered}$ covered input nodes and $n_0$ decoded input nodes. As there are no conflicts for k=1, a node of degree D must not have any link (or edge) with a decoded input node. Therefore, one will always add $n_0$ at the last step with $E_{conflicts}$(0,D) = 0.]
      If L ≦ D+$n_0$ Then Return TRUE
      If k > L − D Then Break (for i=1 to n(k) loop)
   EndFor
EndFor
Return FALSE.

The preceding heuristic can still be improved in order to consider possible conflicts and to avoid to exceed a chosen objective while considering conflicts. Indeed, it is possible to consider that one can add a node of degree k greater than L−D (k>L−D) and one can have a node of degree L if enough conflicts occur. This can be done by means of a routine such as the following one:

```
D=0
For k=d to 2
    For i=1 to n(k) [where n(k) is the number of known nodes of degree k]
        D=max(D,D+k-2*E_{conflicts}(k,D))
        If L ≦ D+n_0 Then Return TRUE
        If k-2*E_{conflicts}(k,D) > L − D Then Break (for i=1 to n(k) loop)
    EndFor
EndFor
Return FALSE.
```

It is also important to note that the choice of the heuristic will have an impact on the computation cost and on the performance of the LT codes. The simpler the heuristic is, the lower the computation cost will be and the lower the performance will be.

If the heuristic(s) used show(s) that an output node of degree d can be generated, the re-encoding module RM finishes the first method step by combining at least one partially decoded node to produce a generated output node having this degree d. Otherwise it tries the following degree suggestion until it finds a degree suggestion that can be satisfied. This last situation will occur because, at least, it is possible to copy one of the nodes previously received. So, it is of interest to try to generate encoded symbols having degrees with the highest deficit of generated symbols.

In order to generate a node of degree d the re-encoding module RM may proceed as follows.

It can start from partially decoded nodes of degree d and add partially decoded nodes until having a node of degree d. Each time it adds a partially decoded node, it gets a new resulting value which is equal to the previous value XOR the value of the partially decoded node added. Then, it adds the input node(s), contributing to the partially decoded node added, to the list of nodes contributing to the resulting node.

During this node generation, the re-encoding module RM starts with degree d nodes and follows with nodes having decreasing degrees up to 1. Indeed it is preferable to first use the biggest symbols and then to use small symbols for completing a generated node in order to succeed to reach exactly the expected degree d. So, one never allows a combination to decrease the degree of a node under generation. Moreover, it is preferable to only try to add a partially decoded node if its degree is lower or equal to the difference between the expected degree and the current degree of the node under generation. As soon as a node under generation has the expected degree d, the re-encoding module RM stops the first method step.

The above described node generation can be done by means of a routine such as the following one, where L is the expected degree determined in the first part of the first method step and G is a partially generated node:

```
L=Result of the first part of first method step
G=Ø
For k=d to 1
    While some node N of degree k as not been tried
        and k ≦ L − degreeOf(G) do
        N = Choose a random node of degree L
        If degreeOf(G+N) > degreeOf(G) then
            G=G+N  (XOR their Value, add input nodes and remove input nodes present twice)
        EnfIf
    EndWhile
EndFor
Return G.
```

It is important to note that when the re-encoding module RM uses a heuristic which considers possible occurrences of conflicts, it is possible to allow the degree of the node under generation to fall temporarily. That amounts to relax one of the constraints of the node generation mechanism described above. But, one still keeps on adding a partially decoded node if its degree is lower or equal to the difference between the expected degree and the current degree of the node under generation. This variant of node generation can be done by means of a routine such as the following one:

```
L=Result of the first part of the first step
G=Ø
For k=d to 1
    While some node n of degree k as not been tried
        and k ≦ L − degreeOf(G) do
        N = Choose a random node of degree L
        G=G+L  (XOR their Value, add input nodes and remove input nodes present twice)
    EndWhile
EndFor
Return G.
```

The preceding node generation mechanism may be enhanced by relaxing the constraint consisting in only adding a partially decoded node if its degree is lower or equal to the difference between the expected degree and the current degree of the node under generation. In this variant, conflicts are still taken into account. For instance, when a node N of degree L is under generation, the re-encoding module RM may try to add a partially decoded node of degree d to a generated node of degree D only if $L-D \geq d-2 \cdot E_{conflicts}(d,D)$. This variant of node generation is more useful if the last described heuristic is used. It can be done by means of a routine such as the following one:

```
L= Result of the first part of the first step
G=Ø
For k=d to 1
    While some node n of degree k as not been tried
        and k − 2.E_{Conflicts}(k,degreeOf(G)-i_{added}) ≦ L − degreeOf(G)
        and degreeOf(G) < L do
        N = Choose a random node of degree L
        G=G+N   (XOR their Value, add input nodes and remove input nodes present twice)
    EndWhile
EndFor
Return G.
```

In case where there is a lot of nodes of a low degree (such as 1, 2 or 3) it is possible to decide to only use low degree nodes to build high degree nodes instead of starting by adding nodes of the highest possible degree. For this purpose, one can, for instance, use into the last routine a "For loop" going from 1 to 1 (in order to use only nodes of degree 1), or from 2 to 1 (in order to use only nodes of degrees 1 and 2), or else from 3 to 1 (in order to use only nodes of degrees 1, 2 and 3).

It is also possible, for instance, to choose a node of degree 1 to be added depending on its score (i.e. its difference with a second chosen reference distribution) instead of choosing a random node of this degree 1. This only requires that the nodes of degree 1 be sorted depending on their score which can be deduced from the second chosen reference distribution.

After having produced a generated output node with the first method step, this generated output node can be refined by means of a second method step.

This second method step may consist in normalizing the current distribution of the input nodes of the Tanner graph in order it could be maintained close to an optimal distribution (or second chosen reference distribution), such as a uniform distribution, for instance.

For this purpose, the re-encoding module RM may compare the current distribution of the input nodes with a second chosen reference distribution in order to determine at least one input node which has been too much used to produce generated output nodes and allows to let unchanged the degree of the generated output node when combined to input nodes linked to the generated output node.

The current distribution of input nodes can be computed by the re-encoding module RM from information relative to the output nodes it has previously generated and that it stores into a storing means, such as a memory, for instance.

Figure 4:
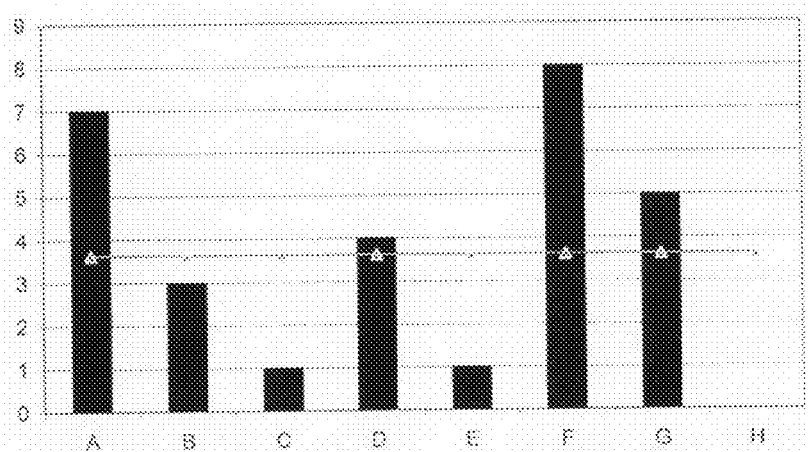
FIG. 4 is a graph illustrating an example of uniform distribution of input nodes (horizontal line) and an example of current (presented) distribution of generated input nodes (black), and FIG. 5 schematically illustrates method sub steps allowing to refine a generated output node of degree 4 with an output node of degree 2.

An example of uniform distribution of input nodes (horizontal line) and an example of current (presented) distribution of degrees of generated input nodes (in black) are both illustrated in the graph of FIG. 4. A uniform input node distribution is a distribution in which any input node is used the same number of time.

In the example illustrated in FIG. 4, one may observe that one should avoid to send the input node A or F again and to prefer send the input node C or E instead.

When the re-encoding module RM has determined at least one too much used input node, it may replace at least one of these too much used input nodes (it has determined) into the generated output node by an input node having been too rarely used, in order to normalize the current distribution of the input nodes.

It is advantageous to use output nodes comprising a too much used input node and having a chosen degree equal to 2. Indeed, it is recalled that LT code symbols have more than 50% of (encoded) output nodes having a degree equal to 2 (when they are quite long). So, as $x \oplus x = 0$, if one has a partially generated node $s = a \oplus b \oplus c \oplus d$ and a degree 2 output node $t = a \oplus e$, it is possible to produce a generated output node $r = s \oplus t = e \oplus b \oplus c \oplus d$ (the input node a (here considered as too much used) has been removed and replaced by the input node e (here considered as too rarely used)).

Figure 5:
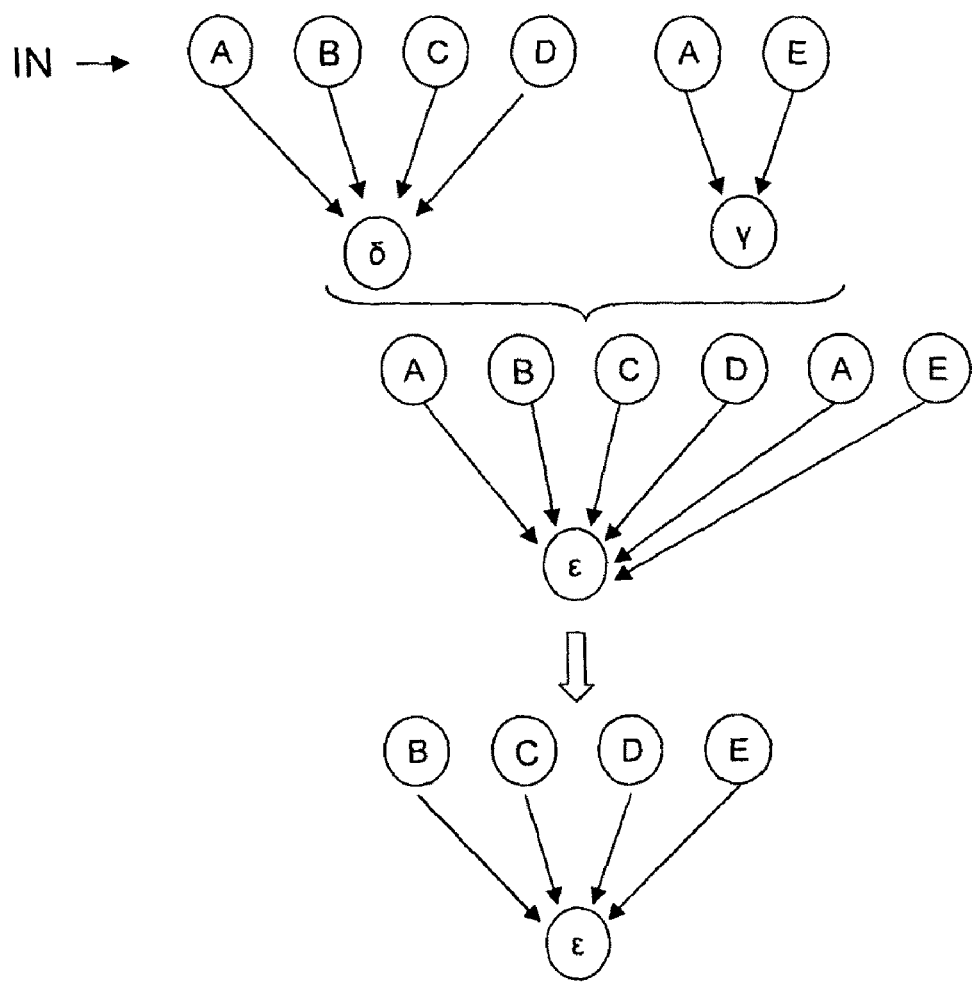

An example of method sub steps allowing to refine a generated output node $\delta$ of degree 4 ($\delta = A \oplus B \oplus C \oplus D$) with an output node $\gamma$ of degree 2 ($\gamma = A \oplus E$) is illustrated in FIG. 5. As $A \oplus A = 0$, the refined generated output node $\beta$ is still of degree 4 but the too much used input node A has been replaced by the too rarely used input node E ($\delta = E \oplus B \oplus C \oplus D$).

To proceed to the refinement of a generated output node, the re-encoding module RM may proceed as follows. For each input node N included in the generated output node to be refined, it searches all output nodes of degree 2 that contains this input node N. Then it may search amongst these output nodes the one which is capable of best enhancing the score of the generated output node to be refined. If the enhancement is positive, it performs the combination (XOR). Then, it can go to another input node N included in the generated output node to be refined and repeat this process. If a conflict occurs (i.e. if the degree of the generated output node to be refined may be decreased, it does not perform the combination (XOR)).

It is important to note that instead of simply forbidding combination to occur in case of the above mentioned conflict, it is possible to allow the combination to be performed provided one finds two input nodes of degree 1 which offer together a better score than the conflicting output node of degree 2. This allows to introduce more diversity and to use nodes of degree 1 more often in combination.

After having produced a (refined) generated output node ready to be transmitted, the re-encoding module RM may update the information representative of the current distribution of degrees of the generated output nodes and the current distribution of the input nodes of the Tanner graph, that it stores into a storing means, in order to use the updated distributions during the following re-encoding. The update of the distribution of input nodes can be done by adding one occurrence for each input node included in the generated output node.

Instead of saving the really generated degrees, it is possible to save the degree one has wanted (or expected) to generate (i.e. the one determined during the first part of the first method step), in case where the real degree of the generated output node differs from the wanted degree and where the degree of the generated output node is allowed to fall during the second method step. This action is unnecessary when the heuristic is sufficiently precise.

In order to ease the task of the network re-encoding device D it is advantageous to adapt the classical decoding module DDM of the decoder DC. More precisely, when a decoding module DDM has decoded received LT code symbols it updates its Tanner graph, which is used by the network re-encoding device D for searching output and input nodes depending on their respective degrees. So, the decoding module DM of the decoder DC is preferably modified for storing data defining the input nodes and output nodes in correspondence with their respective degree in its Tanner graph. These data may be stored in the form of indexes, for instance, in order to be easily accessible to the network re-encoding device D. So the decoding module DM maintains a table of indexes allowing the re-encoding module RM to choose randomly nodes of a particular degree and also to know how much nodes of each degree are present into the Tanner graph of the decoder DC.

The modified decoding module DDM according to the invention is preferably made of software modules, at least partly. But it could be also made of electronic circuit(s) or hardware modules, or a combination of hardware and software modules (in this case it comprises also a software interface allowing interworking between the hardware and software modules). In case where it is exclusively made of software modules it can be stored in a is memory of the decoder DC, or in any computer software product, such as a CD-ROM, for instance, which can be read by a communication equipment CEi.

Moreover, the decoder DC may be further modified in order to be capable of detecting node redundancies and therefore to simplify the task of the network re-encoding device D. Indeed, the node redundancy is increased by the network re-encoding method according to the invention, because the latter tends to produce more redundant blocks of LT code symbols which increases the decoding complexity (both computational and space) and decreases the performance of the network re-encoder device D (which uses the decoder's data).

So, the invention proposes to add to a decoder DC a detection module DTM arranged, in the presence of an output node to be decoded, for determining if it has been previously received by the decoding module DDM, and, in the affirmative, for generating a message signalling that it has been previously decoded and do not have to be inserted again into the decoder Tanner graph.

It is important to note that the detection module DTM can be used when an output node is received (to determine if it has been previously received and decoded) or during decoding (for instance when an output node $x = a \oplus b \oplus c \oplus d$ is partially decoded to produce another output node y=a⊕c⊕d). In this last case the detector module DTM can check if y is already known or not.

For instance, the detection module DTM may compute quickly a key for a received output node and look into the stored data structures with fast read and insert accesses, such as binary search trees (for instance RB trees ("Red Black trees"—a kind of self balancing binary tree)), or hash tables. If it can find that another key has already been inserted, it can conclude that the same output node has already been received and that it does not have to be decoded again. So, it generates a message in order the received output node be simply dropped instead of being inserted into the Tanner graph of the decoder DC.

As most of the output nodes have a low degree (equal to 2 or 3) and that the probability that two output nodes of degree 2 are the same is much higher than the probability that two output nodes of degree 4 are the same, it is possible to restrain the redundancy detection to output nodes of degree 1, 2 or 3. In this case, the detection module DTM may implement a hash method intended for computing a key h(x) for any output node x of degree 1, 2 or 3 such that h(x)=h(x')⇔x=x'. This hash method may be as follows.

First, the detection module DTM may sort the original symbols that compound an encoded symbol (or output node) in increasing order (for instance by considering their identifiers). Then, it may compute the key $h(x)=s_1+s_2 \cdot (L+1)+s_3 \cdot (L+1)^2$ where x=a⊕b⊕c, $s_1=i_a+1$, $s_3=i_b+1$, $s_2=i_c+1$, L is the symbol (or LT code symbols) length, and $i_x$ is an integer identifying a symbol (or input node) x and taking values between 0 and L−1. If a symbol is of degree 2, one simply sets $s_3=0$, and if a symbol is of degree 1, one simply sets $s_3=0$ and $s_2=0$.

This hash method requires only few (constant) additions and multiplications to compute the key h(x). Moreover, this computed key does not require a lot of storing space as one can show that its length is equal to 3 $\log_2(L+1)$. More, the redundancy detection method involves a low cost (for instance, for an output code of length L=65536, it will involves a 64 bit comparison, which is generally offered by general purpose processors).

The detection module DTM according to the invention is preferably made of software modules, at least partly. But it could be also made of electronic circuit(s) or hardware modules, or a combination of hardware and software modules (in this case it comprises also a software interface allowing interworking between the hardware and software modules). In case where it is exclusively made of software modules it can be stored in a memory of the communication equipment CEi (for instance in its decoder DC), or in any computer software product, such as a CD-ROM, for instance, which can be read by a communication equipment CEi.

The invention offers several advantages, and notably:
it allows to generate low complexity network codes,
it can be used in a wide range of applications because it allows to generate network codes which are more efficient in terms of computation than random linear network codes (RLNCs) as they may use belief propagation decoding instead of a Gaussian elimination and therefore avoid the use of Gallois Field (GF($2^k$)) arithmetic.

The invention is not limited to the embodiments of network re-encoding method, network re-encoding device and decoder described above, only as examples, but it encompasses all alternative embodiments which may be considered by one skilled in the art within the scope of the claims hereafter.

The invention claimed is:

1. Network re-encoding method for re-encoding encoded symbols to be transmitted to at least one communication equipment (CE) connected to a network, comprising the step of re-encoding output nodes, defined by LT code symbols representative of encoded symbols and representative respectively of the results of XOR Boolean operation(s) between input nodes defining decoded symbols whose values have to be discovered and to which they are linked into a Tanner graph, by combining chosen input node(s) and/or output node(s) having known values and called partially decoded nodes, in order to produce new LT code symbols defining generated output nodes ready to be transmitted;
wherein during said combining step one combines said partially decoded nodes by means of XOR Boolean operations therebetween;
and wherein during said combining step one starts by determining among degrees of a current distribution of degrees of the generated output nodes the one having the highest difference with a same degree of a first chosen reference distribution, and which allows to produce a generated output node having this degree, then one produces a generated output node having this degree by combining at least one partially decoded node.

2. Method according to claim 1, wherein in said combining step one determines a degree allowing to produce a generated output node having this degree by means of a chosen heuristic.

3. Method according to claim 1, wherein, after having produced said generated output node, one compares the current distribution of said input nodes with a second chosen reference distribution in order to determine if at least one input node has been too much used to produce generated output nodes and in the affirmative if this input node allows to let unchanged the degree of said generated output node when combined to input nodes linked to said generated output node, then one replaces at least one of said too much used input nodes into said generated output node by an input node having been too rarely used, in order to normalize said current distribution of said input nodes.

4. Method according to claim 3, wherein one combines said generated output node with an output node comprising said too much used input node and having a degree equal to 2.

5. Method according to claim 1, wherein in said combining step after having produced said generated output node ready to be transmitted one updates said current distribution of degrees of the generated output nodes and said current distribution of the input nodes.

6. Method according to claim 2, wherein in said combining step said heuristic consists in checking that the degree of the node to be generated is lower or equal to a number of covered input nodes comprising the decoded input nodes and the input nodes having at least one neighbor.

7. Method according to claim 6, wherein said heuristic further consists in checking if the condition $$d \le \sum_1^d k \cdot n(k)$$

is verified, where d is the determined degree of the output node to be generated and n(k) is the number of partially decoded nodes of degree k smaller than d that are known.

8. Network re-encoding device for re-encoding encoded symbols to be transmitted to at least one communication equipment connected to a network, comprising a re-encoding means arranged for re-encoding output nodes, defined by LT code symbols representative of encoded symbols and representative respectively of the results of XOR Boolean operation between input nodes defining decoded symbols whose values have to be discovered and to which they are linked into a Tanner graph, by combining chosen input node and/or output node having known values and called partially decoded nodes, in order to produce new LT code symbols defining generated output nodes ready to be transmitted;

wherein said re-encoding means is arranged for combining said partially decoded nodes by carrying out XOR Boolean operations therebetween;

wherein said re-encoding means is arranged for determining among degrees of a current distribution of degrees of the generated output nodes the one having the highest difference with a same degree of a first chosen reference distribution, and which allows to produce a generated output node having this degree, then for combining at least one partially decoded node to produce a generated output node having this degree.

9. Network re-encoding device according to claim 8, wherein said re-encoding means is arranged for applying a chosen heuristic to determine a degree allowing to produce a generated output node having this degree.

10. Network re-encoding device according to claim 8, wherein said re-encoding means is arranged, after having produced said generated output node, for comparing the current distribution of said input nodes with a second chosen reference distribution in order to determine if at least one input node has been too much used to produce generated output nodes and in the affirmative if this input node allows to let unchanged the degree of said generated output node when combined to input nodes linked to said generated output node, then for replacing at least one of said too much used input nodes into said generated output node by an input node having been too rarely used, in order to normalize said current distribution of said input nodes.

11. Network re-encoding device according to claim 10, wherein said re-encoding means is arranged for combining said generated output node with an output node comprising said too much used input node and having a degree equal to 2.

12. Network re-encoding device according to claim 8, wherein said re-encoding means is arranged, after having produced said generated output node ready to be transmitted, for updating said current distribution of degrees of the generated output nodes and said current distribution of the input nodes.

13. Network re-encoding device according to claim 8, wherein said re-encoding means is arranged for applying a heuristic consisting in checking that the degree of the node to be generated is lower or equal to a number of covered input nodes comprising the decoded input nodes and the input nodes having at least one neighbor.

14. Network re-encoding device according to claim 13, wherein said re-encoding means is arranged for applying a heuristic further consisting in checking if the condition $$d \leq \sum_{1}^{d} k \cdot n(k)$$

is verified, where d is the determined degree of the output node to be generated and n(k) is the number of partially decoded nodes of degree k smaller than d that are known.

* * * * *